United States Patent
Matsumura et al.

(10) Patent No.: US 11,753,714 B2
(45) Date of Patent: Sep. 12, 2023

(54) WASHING METHOD OF SEMICONDUCTOR MANUFACTURING DEVICE COMPONENT HAVING GAS HOLES

(71) Applicant: Shinryo Corporation, Kita Kyushu (JP)

(72) Inventors: Tomohiro Matsumura, Kita Kyushu (JP); Akihiro Matsumoto, Kita Kyushu (JP)

(73) Assignee: Shinryo Corporation, Kita Kyushu (JP)

( * ) Notice: Subject to any disclaimer, the term of this patent is extended or adjusted under 35 U.S.C. 154(b) by 0 days.

(21) Appl. No.: 17/577,461

(22) Filed: Jan. 18, 2022

(65) Prior Publication Data

US 2022/0136101 A1  May 5, 2022

Related U.S. Application Data

(63) Continuation of application No. PCT/JP2020/032168, filed on Aug. 26, 2020.

(30) Foreign Application Priority Data

Aug. 28, 2019 (JP) .................................. 2019-155485

(51) Int. Cl.
*B08B 7/00* (2006.01)
*C23C 16/44* (2006.01)
(Continued)

(52) U.S. Cl.
CPC ............ *C23C 16/4405* (2013.01); *B08B 3/08* (2013.01); *B08B 7/005* (2013.01); *B08B 7/0042* (2013.01);
(Continued)

(58) Field of Classification Search
CPC ............ C23C 16/4405; C23C 16/4407; C23C 16/45565; B08B 3/08; B08B 7/0042; B08B 7/005
See application file for complete search history.

(56) References Cited

U.S. PATENT DOCUMENTS

2002/0185554 A1  12/2002  Lu et al.
2004/0231706 A1  11/2004  Bhatnagar et al.
(Continued)

FOREIGN PATENT DOCUMENTS

EP  1 553 208 A2  7/2005
JP  2002-231699 A  8/2002
(Continued)

OTHER PUBLICATIONS

Machine Translation of JP2011-184774A (Year: 2011).*
(Continued)

*Primary Examiner* — Sharidan Carrillo
(74) *Attorney, Agent, or Firm* — Oblon, McClelland, Maier & Neustadt, L.L.P.

(57) ABSTRACT

A method for cleaning a semiconductor fabrication equipment part having gas holes used in single-wafer type semiconductor fabrication equipment for processing semiconductor wafers, wherein the semiconductor fabrication equipment part having gas holes is formed of aluminum or an aluminum alloy, and has a distribution plate having a plurality of gas holes, the method including: a step (1) of scanning a gas injection surface of the distribution plate, which is a surface facing the wafer, with a laser beam; and a step (2) of bringing the gas injection surface and insides of the gas holes into contact with a cleaning liquid containing an inorganic acid.

20 Claims, 1 Drawing Sheet

(51) Int. Cl.
*B08B 3/08* (2006.01)
*C23C 16/455* (2006.01)

(52) U.S. Cl.
CPC .... *C23C 16/4407* (2013.01); *C23C 16/45565* (2013.01)

(56) References Cited

U.S. PATENT DOCUMENTS

| | | | |
|---|---|---|---|
| 2005/0145170 | A1 | 7/2005 | Matsubara et al. |
| 2008/0092806 | A1 | 4/2008 | West et al. |
| 2008/0283086 | A1 | 11/2008 | Matsubara et al. |
| 2009/0029503 | A1 | 1/2009 | Arai et al. |
| 2011/0139174 | A1 | 6/2011 | Huang |
| 2012/0107520 | A1 | 5/2012 | West et al. |
| 2014/0076354 | A1 | 3/2014 | West et al. |
| 2022/0136101 | A1* | 5/2022 | Matsumura ............ B08B 7/005 134/1 |

FOREIGN PATENT DOCUMENTS

| | | |
|---|---|---|
| JP | 2005-167087 A | 6/2005 |
| JP | 2009-054997 A | 3/2009 |
| JP | 4668915 B2 | 4/2011 |
| JP | 2011-184774 A | 9/2011 |
| JP | 2012-064773 A | 3/2012 |
| JP | 4982931 B2 | 7/2012 |

OTHER PUBLICATIONS

Machine Translation of JP2012-064773A (Year: 2012).*
Extended European Search Report dated Sep. 20, 2022, in European Patent Appiication No. 208577023, citing documents No. 1-7 and 15-17 therein, 11 pages.
International Search Report dated Sep. 29, 2020 in PCT/JP2020/ 032168 filed on Aug. 26, 2020, citing documents AA & AQ-AS therein, 4 pages (with English Translation).
Japanese Office Action dated Mar. 22, 2022 in Japanese Patent Application No. 2021-049694 (with English transiation), citing document AA therein, 11 pages.

* cited by examiner

WASHING METHOD OF SEMICONDUCTOR MANUFACTURING DEVICE COMPONENT HAVING GAS HOLES

This application is a continuation application of, and claims priority from, International Application No. PCT/JP2020/032168, filed on Aug. 26, 2020, and claims priority from Japanese Patent Application No. 2019-155485, filed on Aug. 28, 2019, the contents of which are incorporated herein by reference.

BACKGROUND OF THE INVENTION

Field of the Invention

The present invention relates to a method for cleaning semiconductor fabrication equipment part having gas holes.

Description of the Related Art

In a single-wafer type semiconductor fabrication equipment for processing semiconductor wafers, a shower head is provided for uniformly injecting gas onto semiconductor wafers in the process of etching or forming a film on the surface of the wafers.

The shower head is usually formed of aluminum or an aluminum alloy and has a distribution plate having a plurality of through holes (gas holes). Deposits generated by the gas injected from the shower head adhere to the surface (gas injection surface) of the distribution plate on its side facing the wafer. The deposits also adhere to the inside of the gas holes; therefore, continuous use of the shower head without removing the deposits eventually results in clogging of the gas holes. Therefore, it is necessary to clean the gas injection surface of the shower head to remove deposits.

JP 2005-167087 A (Patent Document 1) describes a cleaning method for removing a target film which is a metal oxide film that is formed of aluminum or an aluminum alloy and stays adhered to the surface to be cleaned, which method is characterized by the use of a cleaning solution containing at least ammonium fluoride, hydrofluoric acid, and ethylene glycol, or a cleaning solution consisting of an acetic acid solution of ammonium fluoride.

JP 4668915 B (Patent Document 2) describes a method for cleaning off process-origin deposits from a component of a process chamber of a substrate processing apparatus, wherein the component has a plurality of gas holes. The method involves a step (a) of mechanically pushing a plurality of extension pins spaced apart to match the layout of the gas holes in the component into the gas holes of the component so as to allow the extension pins to pass through the insides of the gas holes to simultaneously remove the process-origin deposits in the gas holes, thereby cleaning off the process-origin deposits from the gas holes, a step (b) of exposing the component to an acidic solution, and a step (c) of plasma-stabilizing the component by a substep (1) of placing the component in a plasma zone, a substep (2) of introducing gas into the plasma zone, a substep (3) of forming a plasma of the gas in the plasma zone, and a step of (4) of exhausting the gas from the plasma zone.

SUMMARY OF THE INVENTION

Technical Problem

However, thin films formed on semiconductor devices have grown denser than conventional ones as a result of semiconductor process shrink. As a consequence, in recent processes, the denser deposits are caused to adhere to the gas injection surface of the shower head as well. The present inventors have found that a cleaning treatment implemented for removing such dense deposits using the cleaning liquid described in JP 2005-167087 A (Patent Document 1) or an inorganic acid such as nitric acid takes a long time. Such a long time cleaning treatment increases the dissolution of the distribution plate and thereby increases the diameter of the gas holes, which prevents film formation with uniform film thickness during the film formation process of the wafer.

Further, when the method for cleaning off the process-origin deposits according to Patent Document 2 is applied to a semiconductor fabrication equipment part having gas holes, the step (a) requires considerable time and labor, and the semiconductor fabrication equipment part having gas holes cannot be cleaned with ease and in a short time.

In this situation, the object of the present invention is to provide a method for cleaning a semiconductor fabrication equipment part having gas holes, which is simple and can shorten the cleaning time.

Solution to Problem

[1] A method for cleaning a semiconductor fabrication equipment part having gas holes used in single-wafer type semiconductor fabrication equipment for processing semiconductor wafers,
wherein the semiconductor fabrication equipment part having gas holes is formed of aluminum or an aluminum alloy, and has a distribution plate having a plurality of gas holes,
the method including:
a step (1) of scanning a gas injection surface of the distribution plate, which is a surface facing the wafer, with a laser beam; and
a step (2) of bringing the gas injection surface and insides of the gas holes into contact with a cleaning liquid containing an inorganic acid.

[2] The method according to [1], wherein an average energy of the laser beam is 1 to 10000 W.

[3] The method according to [1] or [2], wherein an average energy density of the laser beam is $1 \times 10^3$ to $1 \times 10^{13}$ W/m$^2$.

[4] The method according to any one of [1] to [3], wherein the laser beam is a pulse beam.

[5] The method according to [4], wherein the pulse beam has a pulse frequency of 1 Hz to 5000 kHz.

[6] The method according to any one of [1] to [5], wherein the laser beam is generated by any one selected from the group consisting of a $CO_2$ laser, a He—Ne laser, an argon laser, a YAG laser, an Nd: YAG laser, an Er: Nd-YAG laser, a fiber laser and a high-power diode laser.

[7] The method according to any one of [1] to [6], wherein a wavelength of the laser beam is 10 nm to 1000 µm.

[8] The method according to any one of [1] to [7], wherein the inorganic acid includes at least one selected from the group consisting of nitric acid, hydrochloric acid, sulfuric acid and hydrofluoric acid.

[9] The method according to any one of [1] to [8], wherein the cleaning liquid includes an oxidizing agent.

[10] The method according to any one of [1] to [9], wherein in the step (2), the semiconductor fabrication equipment part having gas holes is immersed in the cleaning liquid.

[11] The method according to [10], wherein the semiconductor fabrication equipment part having gas holes is held immersed in the cleaning liquid for 0.5 to 24 hours.

[12] The method according to any one of [1] to [11], wherein deposits are adhered to the gas injection surface and the gas holes of the distribution plate, and the deposits include a reaction product of an etching gas and aluminum.

[13] The method according to any one of [1] to [12], wherein deposits are adhered to the gas injection surface and the gas holes of the distribution plate, and the deposits include a compound derived from a film-forming gas.

[14] The method according to any one of [1] to [13], further including a step (3) of irradiating the gas injection surface with ultrasonic waves between the step (1) and the step (2).

[15] The method according to any one of [1] to [14], wherein the semiconductor fabrication equipment part having gas holes is a shower head.

Advantageous Effects of Invention

The present invention can provide a method for cleaning a semiconductor fabrication equipment part having gas holes, which is simple and can shorten the cleaning time.

DETAILED DESCRIPTION OF THE INVENTION

In the context of the present specification, numerical ranges expressed using "to" include the numerical values described before and after "to".

The term "YAG laser" means a solid-state laser using yttrium aluminum garnet. Further, the term "Nd: YAG laser" means a YAG laser using crystals formed by doping yttrium with a several percent of neodymium (element symbol Nd) in the process of producing YAG crystals, and the term "Er: Nd-YAG laser" means a YAG laser using crystals doped with yttrium with a several percent of neodymium (element symbol Nd) and a several percent of erbium (element symbol Er) in the process of producing YAG crystals.

Hereinbelow, embodiments of the present invention are described, but the present invention is not limited to such embodiments, and various modifications can be made as long as such modifications do not deviate from the substance of the present invention.

[Method for Cleaning Semiconductor Fabrication Equipment Part Having Gas Holes]

The present invention relates to a method for cleaning a semiconductor fabrication equipment part having gas holes used in single-wafer type semiconductor fabrication equipment for processing semiconductor wafers (hereinafter, also referred to simply as "cleaning method of the present invention").

<Semiconductor Fabrication Equipment Part Having Gas Holes>

The semiconductor fabrication equipment part having gas holes (hereinafter, also referred to simply as "semiconductor fabrication equipment part") is formed of aluminum or an aluminum alloy, and has a distribution plate having a plurality of gas holes.

The distribution plate is a part of the semiconductor fabrication equipment part, and may be integrally and undetachably formed with a portion of the semiconductor fabrication equipment part other than the distribution plate, or may be detachably formed with the portion of the semiconductor fabrication equipment part.

A preferred embodiment of the semiconductor fabrication equipment part having gas holes is a shower head.

Figure 1:
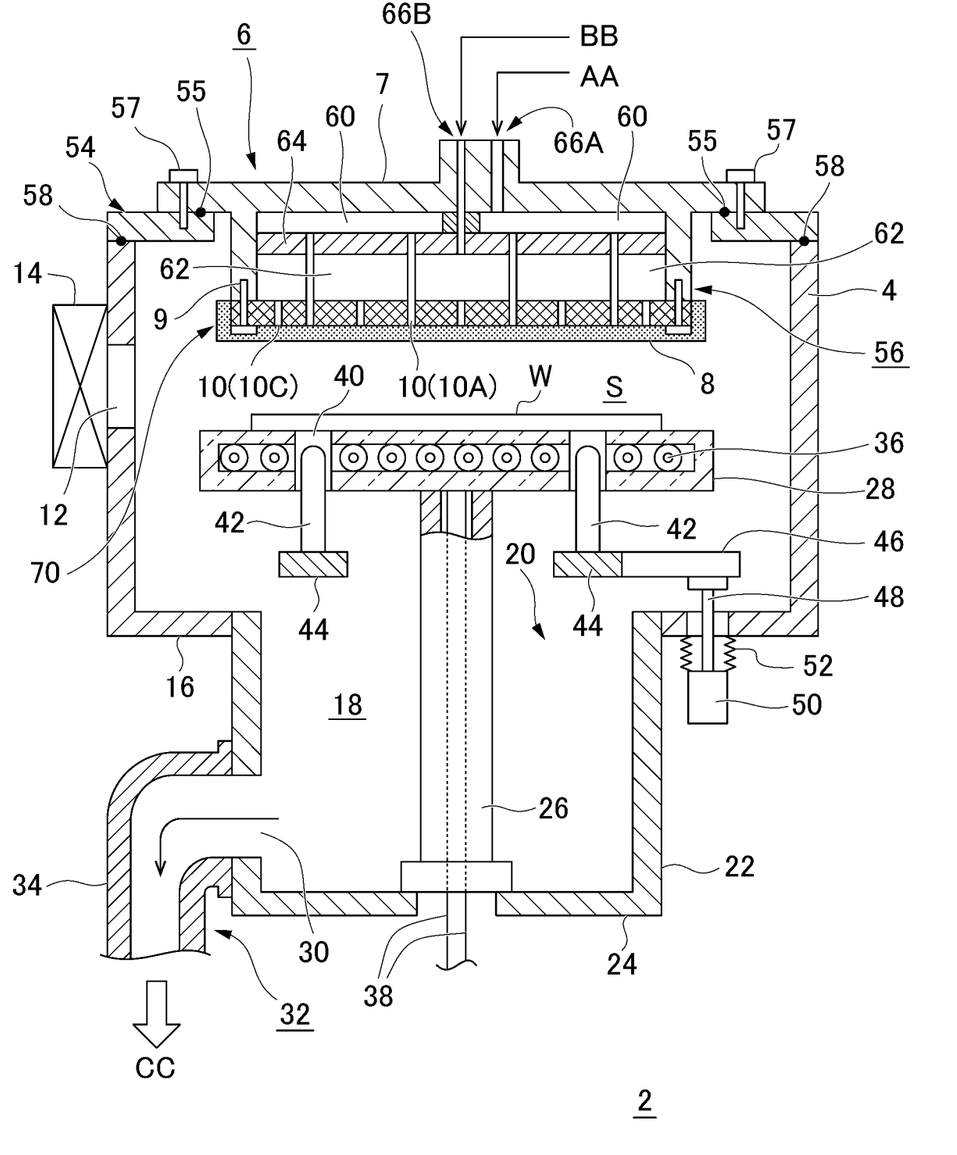
FIG. 1 is a configuration diagram showing a film forming apparatus including a shower head, to which the cleaning method of the present invention is applied.

FIG. 1 shows an example of a film forming apparatus including a shower head. However, the shower head to which the cleaning method of the present invention can be applied is not limited to the example shown in FIG. 1.

The film forming apparatus 2 shown in FIG. 1 has, for example, a processing container 4 made of aluminum or an aluminum alloy, with its inner cross section being substantially cylindrical. A shower head 6 for introducing a necessary processing gas, for example, a raw material gas for film formation or other support gas, is provided on the ceiling of the processing container 4, and the apparatus is configured to blow out the processing gas from many gas holes 10 provided on a distribution plate 8 on the lower surface of the shower head toward the processing space S.

Further, the side wall of the processing container 4 is provided with a loading/unloading port 12 for loading and unloading a substrate W such as a semiconductor wafer as an object to be processed into or from the processing container 4, and the loading/unloading port 12 is provided with a gate valve 14 that is configured to be airtightly openable and closable.

An exhaust drop-in space 18 is formed in the bottom 16 of the processing container 4. Specifically, a large opening 20 is formed in the central portion of the bottom 16 of the processing container 4, and a cylindrical partition wall 22 with a closed bottom, extending downward from the bottom 16, is connected to the opening 20, thereby forming the exhaust drop-in space 18 inside. The bottom 24 of the cylindrical partition wall 22 that partitions the exhaust drop-in space 18 is provided with a cylindrical supporting column 26 that extends upward from the bottom 24 and is formed of, for example, quartz glass, and a mounting table 28 is welded to the upper end of the cylindrical supporting column 26. The supporting column 26 and the mounting table 28 may be formed of ceramic such as AlN.

The opening 20 on the side of inlet of the exhaust drop-in space 18 is designed to be smaller than the diameter of the mounting table 28, so that the processing gas flowing down the outside of the peripheral edge of the mounting table 28 is allowed to travel around and sink below the mounting table 28 to flow into the opening 20. An exhaust port 30 is formed on the lower side wall of the cylindrical partition wall 22 so as to face the exhaust drop-in space 18, and a vacuum exhaust system 32 is connected to the exhaust port 30. Specifically, the vacuum exhaust system 32 is composed of an exhaust pipe 34 provided with a vacuum pump (not shown), and the exhaust pipe 34 is connected to the exhaust port 30 so that the atmosphere inside the processing container 4 and the exhaust drop-in space 18 can be evacuated and exhausted.

A pressure adjusting valve (not shown) capable of controlling the opening degree is interposed in the middle of the exhaust pipe 34. By automatically adjusting the valve opening degree, the pressure in the processing container 4 can be maintained at a constant value or can be quickly changed to a desired value.

Further, a heating means 36 composed of, for example, a resistance heating heater such as a carbon wire is embedded in the mounting table 28, and a substrate W such as a semiconductor wafer as an object to be processed is placed on the upper surface of the mounting table 28, so that the substrate W can be heated. The heating means 36 is connected to a feeder cable 38 disposed in the supporting column 26 so that electric power can be supplied in a controlled manner.

The mounting table 28 has a plurality of, for example, three pin insertion holes 40 penetrating in the vertical direction of the mounting table 28 (only two pin insertion holes 40 are shown in FIG. 1), and is provided with push-up pins 42 that are inserted into respective pin insertion holes 40 in a loosely fitted manner so as to be vertically movable. A push-up ring 44 made of a ceramic such as alumina, which is formed in a circular ring shape, is placed at the lower end of the push-up pin 42, and the lower end of each push-up pin 42 is unfixedly supported by the push-up ring 44. The arm 46 extending from the push-up ring 44 is connected to an emerging/sinking rod 48 provided so as to penetrate the bottom 16 of the processing container 4, and the emerging/sinking rod 48 can be raised and lowered by an actuator 50. As a result, each push-up pin 42 is allowed to move upward to emerge from the upper end of each pin insertion hole 40 when the wafer W is delivered. Further, a stretchable bellows 52 is interposed in the penetrating portion of the bottom of the container of the emerging/sinking rod 48 of the actuator 50, so that the emerging/sinking rod 48 can move up and down while maintaining the airtightness in the processing container 4.

Next, an explanation is given below with respect to the shower head 6 to be cleaned as described below.

The shower head 6 is detachably attached to a ceiling board 54 that closes the upper-end opening of the processing container 4 by a bolt 57 via a sealing member 55 such as an O-ring. The shower head 6 has a shower head main body 56 which is in the form of, for example, a cylinder with a closed bottom. In this instance, a sealing member 58 such as an O-ring is interposed between the peripheral portion of the ceiling board 54 and the upper end portion of the processing container 4, so that the airtightness inside the processing container 4 is maintained. The shower head 6 as a whole is formed of aluminum or an aluminum alloy.

A first diffusion chamber 60 for diffusing the raw material gas and a second diffusion chamber 62 for diffusing the support gas are formed as separate compartments in the shower head main body 56. In FIG. 1, the first diffusion chamber 60 and the second diffusion chamber 62 are formed in the shower head main body 56 as separate compartments which are positioned, respectively, above and below a partition plate 64 placed along the horizontal direction. The first diffusion chamber 60 communicates with the processing gas inlet 66A provided on the ceiling board 7 of the shower head 6 for introducing the raw material gas, and the second diffusion chamber 62 communicates with the support gas inlet 66B provided on the ceiling board 7 for introducing the support gas. Further, the plate-shaped distribution plate 8 provided on the lower surface of the shower head main body 56 is detachably attached to the shower head main body 56 by bolts 9.

In this instance, a plurality of gas holes 10 formed in the distribution plate 8 which is the lower surface of the shower head main body 56 are arranged vertically and horizontally to form a uniform matrix pattern in a substantially plan view. The gas holes 10 include raw material gas holes 10A for injecting a raw material gas and second support gas holes 10C, each provided so as to be located between two adjacent raw material gas holes 10A.

<Step (1) and Step (2)>

The cleaning method of the present invention includes the following steps (1) and (2).

Step (1): A step of scanning a gas injection surface of the distribution plate, which is a surface facing the wafer, with a laser beam.

Step (2): A step of bringing the gas injection surface and insides of the gas holes into contact with a cleaning liquid containing an inorganic acid.

(Step (1))

In the step (1), by scanning the gas injection surface with a laser beam, deposits adhering to the gas injection surface of the distribution plate, which is a surface facing the wafer, are removed.

Further, since the laser beam is so irradiated to the inner surfaces of the gas holes provided in the distribution plate, at least a part of the deposits adhering to the inner surfaces of the gas holes is removed as well.

Further, even if the deposits remaining adhered to the inner surfaces of the gas holes are not removed, the irradiation with the laser beam causes physical changes such as cracking. Therefore, when contacting with the cleaning liquid is implemented in the step (2), the cleaning liquid easily permeates the deposits.

The laser source of the laser beam may be, for example, a gas laser such as a $CO_2$ laser, a He—Ne laser or an argon laser, or a solid-state laser such as a YAG laser, an Nd: YAG laser, an Er: Nd-YAG laser, a fiber laser or a high power diode laser.

As the laser source, at least one selected from the group consisting of these gas lasers and solid-state lasers is preferable, and it is more preferable to use any one of these lasers. Particularly, it is even more preferable to use a laser selected from the group consisting of the solid-state lasers described above, and it is even more preferable to use a laser selected from the group consisting of a YAG laser, an Nd:YAG laser and a fiber laser.

By using the laser source of the laser beam as described above, it is possible to remove at least deposits on the gas injection surface without damaging the distribution plate formed of aluminum or an aluminum alloy.

Laser beams from two or more types of laser sources may be used at the same time, or a laser beam from only one type of laser source may be used.

A $CO_2$ laser typically generates a laser beam with a wavelength of 9300 to 10600 nm. An argon laser typically generates a laser beam with a wavelength of 488 nm or 514 nm. An Nd:YAG laser typically generates a laser beam with a wavelength of 1064 nm.

An Er: Nd-YAG laser typically generates a laser beam with a wavelength of 2940 nm. A fiber laser typically generates a laser beam with a wavelength of 1070 nm. A high power diode laser typically generates a laser beam with a wavelength of 810 to 980 nm.

The wavelength of the laser beam is preferably 10 nm to 1000 μm, and more preferably in the range of 700 nm to 1000 μm (infrared light, preferably in the range of 750 to 4000 nm), in the range of 10 to 400 nm (ultraviolet light, preferably in the range of 10 to 380 nm), or in the range of 400 to 700 nm (visible light). Laser beams of multiple wavelengths may be irradiated simultaneously. For easy removal of transparent deposits, a laser beam with a wavelength of 700 nm to 1000 μm is preferable, a laser beam with a wavelength of 750 to 4000 nm is more preferable, a laser beam with a wavelength of 760 to 2000 nm is even more preferable, a laser beam with a wavelength of 785 to 1600 nm is even more preferable, and a laser beam with a wavelength of 1000 to 1100 nm is even more preferable.

The average energy density of a laser beam calculated by dividing the average energy of the laser beam by the irradiation area is not limited as long as the distribution plate formed of aluminum or an aluminum alloy does not suffer damage and at least deposits on the gas injection surface can be removed. The energy density is preferably $1\times10^3$ to $1\times10^{13}$ W/m$^2$, more preferably $1\times10^3$ to $1\times10^{12}$ W/m$^2$, and even more preferably $1\times10^3$ to $1\times10^{11}$ W/m$^2$. With a laser beam having its average energy density adjusted to fall within the range described above, it is possible to remove at least deposits on the gas injection surface without damaging the distribution plate formed of aluminum or an aluminum alloy.

The energy of the laser beam can be freely chosen within the energy density range described above. The average energy of the laser beam is usually chosen so as to have the average energy density fall within the range described above, and is preferably 1 to 10000 W, more preferably 5 to 8000 W, and even more preferably 10 to 5000 W. With the laser beam having its average energy adjusted to fall within the range described above, it is possible to remove at least deposits on the gas injection surface without damaging the distribution plate formed of aluminum or an aluminum alloy.

The beam profile of the laser can be either a Gaussian beam or a top-hat beam. A top-hat beam is preferable because it can remove deposits uniformly without leaving any irradiation marks.

The laser beam may be a continuous wave beam or a pulse beam. A pulse beam is preferable because it is less affected by heat. When the laser beam is a pulse beam, the output of each pulse increases as its frequency decreases. When the laser beam is a pulse beam, the pulse frequency is preferably 1 Hz to 5000 kHz, more preferably 5 Hz to 1000 kHz, and even more preferably 10 Hz to 500 kHz. With a laser beam having its pulse frequency adjusted to fall within the range described above, it is possible to remove at least deposits on the gas injection surface without damaging the distribution plate formed of aluminum or an aluminum alloy.

From the viewpoint of treatment speed and damage to the substrate, the sweep speed is preferably 0.01 to 100 mm/sec, more preferably 0.1 to 50 mm/sec, and even more preferably 1 to 10 mm/sec.

(Step (2))

In the step (2), the gas injection surface and insides of the gas holes are brought into contact with a cleaning liquid containing an inorganic acid, to thereby remove the deposits left unremoved in the step (1).

As described above, the irradiation with the laser beam causes physical changes such as cracking in the film of the deposits, which allows the cleaning liquid to permeate more easily. Therefore, the removal of the deposits is completed in less time than when contacting with the cleaning liquid is implemented without irradiating the laser beam.

The inorganic acid contained in the cleaning liquid is preferably at least one selected from the group consisting of phosphoric acid, boric acid, hydrochloric acid, sulfuric acid, nitric acid and hydrofluoric acid. The inorganic acid is more preferably selected from sulfuric acid, nitric acid and hydrofluoric acid, and even more preferably selected from nitric acid and hydrofluoric acid. The selection of an inorganic acid to be contained in the cleaning liquid from the above list allows for removal of at least deposits on the gas injection surface without damaging the distribution plate formed of aluminum or an aluminum alloy.

The concentration of the inorganic acid is not particularly limited.

Moreover, it is preferable that the cleaning liquid contains an oxidizing agent. Examples of the oxidizing agent include hydrogen peroxide, nitric acid, concentrated sulfuric acid and the like. Nitric acid is particularly preferable because it is an inorganic acid and at the same time acts as an oxidizing agent. Concentrated nitric acid is particularly preferable as the nitric acid. Hydrofluoric acid is particularly useful for removing deposits containing silicon dioxide.

The cleaning liquid may contain water. When the inorganic acid is nitric acid, hydrochloric acid, dilute sulfuric acid or hydrofluoric acid, water is contained in the cleaning liquid.

The cleaning liquid may further contain an additive such as a surfactant.

For bringing the gas injection surface and the inside of the gas holes into contact with the cleaning liquid containing an inorganic acid, for example, it is possible to employ an immersion method involving immersing an object to be cleaned such as a shower head in the cleaning liquid, or a spray method involving spraying the cleaning liquid to an object to be cleaned, of which the immersion method is preferable.

The time for contacting the gas injection surface and the insides of the gas holes with the cleaning liquid containing an inorganic acid is preferably 0.5 to 24 hours, more preferably 1 to 12 hours, and even more preferably 2 to 12 hours. With a relatively short contact time, thinning of the semiconductor fabrication equipment part having the gas holes, which is an object to be cleaned, is suppressed, so that the life of the semiconductor fabrication equipment part can be extended.

<Step (3)>

The cleaning method of the present invention may include a step (3) of irradiating the gas injection surface with ultrasonic waves during or after the step (1) or the step (2).

By irradiating the gas injection surface with ultrasonic waves, further physical defects can be caused in the film of the deposits, the processing time in the step (2) can be further shortened, and thinning of the semiconductor fabrication equipment part having the gas holes, which is an object to be cleaned, can be further suppressed, so that the life of the semiconductor fabrication equipment part can be further extended.

<Technical Effects>

For a semiconductor fabrication equipment part having gas holes, the method of the present invention first irradiates the gas injection surface of the semiconductor fabrication equipment part having gas holes with a laser beam, to thereby remove deposits adhering to the gas injection surface and the surfaces around the gas holes (step 1), and then brings the gas injection surfaces and the insides of the gas holes into contact with a cleaning liquid containing an inorganic acid, to thereby remove the deposits that cannot be removed by the laser beam alone (step 2). In the step 1, even if the deposits adhering at deeper positions inside the gas holes cannot be removed, the film of the deposits is presumably caused to be cracked or peeled off from the inside of the gas holes. In the step 2, the cleaning liquid permeates through the cracks formed in the film of the deposits or the gap formed between the film of the deposits and the inside of the gas holes, which presumably enables the removal of the deposits inside the gas holes in a short time. In the step 2, although the diameters of the gas holes are increased due to the thinning of the distribution plate, the shortness of time required for the step (2) suppresses the diameter increase of the gas holes, and the diameter distribution of the gas holes is not high as compared to the conventional techniques.

Hereinbelow, the present invention is specifically described by way of Examples. However, the present invention is not limited to the Examples described below, and various modifications can be made as long as such modifications do not deviate from the substance of the present invention.

EXAMPLES

Comparative Example 1

(Cleaning by Immersion in Nitric Acid)

An aluminum alloy shower head with aluminum fluoride adhering thereto was prepared.

The shower head was put into concentrated nitric acid from the plasma contact surface so as to have all the gas holes immersed in the concentrated nitric acid, and the shower head was kept in contact with the concentrated nitric acid for 48 hours.

Then, the entire shower head was thoroughly washed with pure water to remove nitric acid.

The entire shower head was then dried using a vacuum oven.

After drying, when the gas injection surface of the shower head was visually observed, it was found that aluminum fluoride was completely removed from areas surrounding the gas holes, but aluminum fluoride remained on a part of the gas injection surface.
(Change in Gas Hole Diameter Due to Nitric Acid Immersion)

The gas hole of the aluminum alloy shower head cleaned by the immersion in nitric acid was magnified and observed using a digital microscope (VHX-900F, manufactured by Keyence) before and after the cleaning, and the diameter of the gas hole before the cleaning and the diameter of the gas hole after the cleaning were measured.

Also, the gas hole of a new aluminum alloy shower head free of aluminum fluoride adhesion was magnified and observed using a digital microscope (the same one as described above), and the diameter of the gas hole before use of the shower head was measured.

The following measurements were obtained.
Gas hole diameter before nitric acid immersion: 972 μm
Gas hole diameter after nitric acid immersion: 1018 μm
Gas hole diameter in unused state: 1016 μm
The gas hole diameter increased by 2 μm as a result of cleaning by the nitric acid immersion.

Comparative Example 2

(Cleaning by Immersion in Nitric Acid)

An aluminum alloy shower head with aluminum fluoride adhering thereto, which was different from the one used in Comparative Example 1, was cleaned by the nitrate immersion implemented in the same manner as in Comparative Example 1. As in Comparative Example 1, complete removal of aluminum fluoride at areas surrounding the gas holes was confirmed, but residual aluminum fluoride was observed on a part of the gas injection surface.
(Change in Gas Hole Diameter Due to Nitric Acid Immersion)

The gas hole of the aluminum alloy shower head cleaned by the immersion in nitric acid was magnified and observed using a digital microscope (the same one as described above) before and after the cleaning, and the diameter of the gas hole before the cleaning and the diameter of the gas hole after the cleaning were measured.

The following measurements were obtained.
Gas hole diameter before nitric acid immersion: 965 μm
Gas hole diameter after nitric acid immersion: 1022 μm
As the gas hole diameter in unused state was 1016 μm, the gas hole diameter increased by 6 μm as a result of cleaning by the nitric acid immersion.

Example 1

(Laser Irradiation)

A YAG laser (Gaussian beam, pulse oscillation with a pulse frequency of 200 kHz) with an average output of 200 W and a wavelength of 1064 nm was continuously swept over the plasma contact surface of an aluminum alloy shower head with aluminum fluoride adhering thereto at a beam diameter of 30 μm and a beam sweep speed of 5 mm/sec.

When the laser irradiated surface was visually observed after the laser irradiation, the removal of aluminum fluoride was confirmed over the entire laser irradiated surface.
(Change in Gas Hole Diameter Due to Laser Irradiation)

The gas hole of the aluminum alloy shower head having been subjected to laser irradiation was magnified and observed using a digital microscope (the same one as described above) before and after the cleaning, and the diameter of the gas hole before the cleaning and the diameter of the gas hole after the cleaning were measured.

The following measurements were obtained.
Gas hole diameter before laser irradiation: 994 μm
Gas hole diameter after laser irradiation: 1006 μm
An increase in the gas hole diameter caused by the laser irradiation was observed. This is because the aluminum fluoride that had been narrowing the gas hole was partially removed.
(Cleaning by Immersion in Nitric Acid)

The shower head after the laser irradiation was put into concentrated nitric acid (40%) from the plasma contact surface so as to have all the gas holes immersed in the concentrated nitric acid, and the shower head was kept in contact with the concentrated nitric acid for 3 hours.

Then, the entire shower head was thoroughly washed with pure water to remove nitric acid.

The entire shower head was then dried using a vacuum oven.

After drying, when the plasma contact surface of the shower head was visually observed, it was found that aluminum fluoride was removed from the whole area of the plasma contact surface.
(Confirmation of Removal of Deposits by Immersion in Nitric Acid)

The cross section of the gas hole of the aluminum alloy shower head cleaned by the immersion in nitric acid is analyzed by an energy dispersive fluorescent X-ray analyzing device before and after the cleaning.

As a result, a significant decrease in fluorine-based peaks is observed over the entire inner surface of the gas hole.

Example 2

(Laser Irradiation)

A YAG laser (top-hat beam, pulse oscillation with a pulse frequency of 10 Hz) with an average output of 40 W and a wavelength of 1064 nm was continuously swept over the plasma contact surface of an aluminum alloy shower head with aluminum fluoride adhering thereto at a beam diameter of 6 mm and a beam sweep speed of 1 mm/sec.

When the laser irradiated surface was visually observed after the laser irradiation, the removal of aluminum fluoride was confirmed over the entire laser irradiated surface. Compared with Example 1 (using a Gaussian beam), the surface uniformity after the laser treatment improved.

(Change in Gas Hole Diameter Due to Laser Irradiation)

The gas hole of the aluminum alloy shower head having been subjected to laser irradiation was magnified and observed using a digital microscope (the same one as described above) before and after the cleaning, and the diameter of the gas hole before the cleaning and the diameter of the gas hole after the cleaning were measured.

The following measurements were obtained.

Gas hole diameter before laser irradiation: 979 μm

Gas hole diameter after laser irradiation: 1007 μm

An increase in the gas hole diameter caused by the laser irradiation was observed. This is because the aluminum fluoride that had been narrowing the gas hole was partially removed.

(Cleaning by Immersion in Nitric Acid)

The shower head after the laser irradiation was put into concentrated nitric acid (40%) from the plasma contact surface so as to have all the gas holes immersed in the concentrated nitric acid, and the shower head was kept in contact with the concentrated nitric acid for 12 hours.

Then, the entire shower head was thoroughly washed with pure water to remove nitric acid.

The entire shower head was then dried using a vacuum oven.

After drying, when the plasma contact surface of the shower head was visually observed, it was found that aluminum fluoride was removed from the whole area of the plasma contact surface.

(Confirmation of Removal of Deposits by Immersion in Nitric Acid)

The cross section of the gas hole of the aluminum alloy shower head cleaned by the immersion in nitric acid is analyzed by an energy dispersive fluorescent X-ray analyzing device before and after the cleaning.

As a result, a significant decrease in fluorine-based peaks is observed over the entire inner surface of the gas hole.

Example 3

(Laser Irradiation)

A YAG laser (top-hat beam, pulse oscillation with a pulse frequency of 10 Hz) with an average output of 40 W and a wavelength of 1064 nm was continuously swept over the plasma contact surface of an aluminum alloy shower head with aluminum fluoride adhering thereto at a beam diameter of 6 mm and a beam sweep speed of 5 mm/sec.

When the laser irradiated surface was visually observed after the laser irradiation, the removal of aluminum fluoride was confirmed over the entire laser irradiated surface.

Compared with Example 1 (using a Gaussian beam), the surface uniformity after the laser treatment improved.

(Change in Gas Hole Diameter Due to Laser Irradiation)

The gas hole of the aluminum alloy shower head having been subjected to laser irradiation was magnified and observed using a digital microscope (the same one as described above) before and after the cleaning, and the diameter of the gas hole before the cleaning and the diameter of the gas hole after the cleaning were measured.

The following measurements were obtained.

Gas hole diameter before laser irradiation: 978 μm

Gas hole diameter after laser irradiation: 1009 μm

An increase in the gas hole diameter caused by the laser irradiation was observed. This is because the aluminum fluoride that had been narrowing the gas hole was partially removed.

(Cleaning by Immersion in Nitric Acid)

The shower head after the laser irradiation was put into concentrated nitric acid (40%) from the plasma contact surface so as to have all the gas holes immersed in the concentrated nitric acid, and the shower head was kept in contact with the concentrated nitric acid for 12 hours.

Then, the entire shower head was thoroughly washed with pure water to remove nitric acid.

The entire shower head was then dried using a vacuum oven.

After drying, when the plasma contact surface of the shower head was visually observed, it was found that aluminum fluoride was removed from the whole area of the plasma contact surface.

(Confirmation of Removal of Deposits by Immersion in Nitric Acid)

The cross section of the gas hole of the aluminum alloy shower head cleaned by the immersion in nitric acid is analyzed by an energy dispersive fluorescent X-ray analyzing device before and after the cleaning.

As a result, a significant decrease in fluorine-based peaks is observed over the entire inner surface of the gas hole.

Example 4

(Laser Irradiation)

A YAG laser (top-hat beam, pulse oscillation with a pulse frequency of 10 Hz) with an average output of 40 W and a wavelength of 1064 nm was continuously swept over the plasma contact surface of an aluminum alloy shower head with aluminum fluoride adhering thereto at a beam diameter of 6 mm and a beam sweep speed of 8 mm/sec.

When the laser irradiated surface was visually observed after the laser irradiation, the removal of aluminum fluoride was confirmed over the entire laser irradiated surface. Compared with Example 1 (using a Gaussian beam), the surface uniformity after the laser treatment improved.

(Change in Gas Hole Diameter Due to Laser Irradiation)

The gas hole of the aluminum alloy shower head having been subjected to laser irradiation was magnified and observed using a digital microscope (the same one as described above) before and after the cleaning, and the diameter of the gas hole before the cleaning and the diameter of the gas hole after the cleaning were measured.

The following measurements were obtained.

Gas hole diameter before laser irradiation: 976 μm

Gas hole diameter after laser irradiation: 1011 μm

An increase in the gas hole diameter caused by the laser irradiation was observed. This is because the aluminum fluoride that had been narrowing the gas hole was partially removed.

(Cleaning by Immersion in Nitric Acid)

The shower head after the laser irradiation was put into concentrated nitric acid (40%) from the plasma contact surface so as to have all the gas holes immersed in the concentrated nitric acid, and the shower head was kept in contact with the concentrated nitric acid for 12 hours.

Then, the entire shower head was thoroughly washed with pure water to remove nitric acid.

The entire shower head was then dried using a vacuum oven.

After drying, when the plasma contact surface of the shower head was visually observed, it was found that aluminum fluoride was removed from the whole area of the plasma contact surface.

(Confirmation of Removal of Deposits by Immersion in Nitric Acid)

The cross section of the gas hole of the aluminum alloy shower head cleaned by the immersion in nitric acid is analyzed by an energy dispersive fluorescent X-ray analyzing device before and after the cleaning.

As a result, a significant decrease in fluorine-based peaks is observed over the entire inner surface of the gas hole.

Comparative Example 3

(Cleaning by Immersion in Nitric Acid)

An aluminum alloy shower head with aluminum fluoride adhering thereto was prepared.

This shower head was put into concentrated nitric acid from the gas injection surface so as to have all the gas holes immersed in the concentrated nitric acid, and the shower head was kept in contact with the concentrated nitric acid for 3 hours.

Then, the entire shower head was thoroughly washed with pure water to remove nitric acid.

The entire shower head was then dried using a vacuum oven.

After drying, when the gas injection surface and the inside of the gas holes of the shower head were visually observed, the presence of residual aluminum fluoride was confirmed.

[Discussion of Results]

In Comparative Examples 1 and 2, aluminum fluoride adhering to the inner surfaces of the gas holes of the shower head and surrounding areas was able to be removed, and the narrowing and clogging of the gas holes were able to be resolved. However, the gas hole diameter increased due to the nitric acid immersion. In addition, the removal of aluminum fluoride on the gas injection surface was insufficient.

In Comparative Example 3, the removal of aluminum fluoride adhering to the plasma contact surface and the inner surfaces of the gas holes of the shower head was insufficient.

In Example 1, aluminum fluoride adhering to the plasma contact surface and the inner surfaces of the gas holes was successfully removed with less time than in Comparative Examples 1 and 2, and the narrowing and clogging of the gas holes was successfully resolved. In addition, there was almost no change in the gas hole diameter before and after the cleaning.

The results of Comparative Examples 1 and 2 show that the smaller gas hole diameter before cleaning with nitric acid, the larger gas hole diameter after cleaning by the cleaning operation. This is because it is necessary to immerse the shower head in nitric acid for a long time in order to completely remove aluminum fluoride, and the shower head at its sections uncoated with aluminum fluoride is etched and dissolved by nitric acid during the immersion.

These results show that, by cleaning with the cleaning liquid after the laser irradiation, the deposits on the gas injection surface and the inner surfaces of the gas holes of the shower head can be completely removed without increasing the gas hole diameter.

INDUSTRIAL APPLICABILITY

The cleaning method of the present invention can complete the cleaning of a semiconductor fabrication equipment part having gas holes within a shorter period of time, and also can extend the life of the semiconductor fabrication equipment part having gas holes as compared to the conventional techniques. Therefore, the cleaning method of the present invention enables the production of semiconductor wafers at a lower cost.

DESCRIPTION OF THE REFERENCE SIGNS

2 Film forming apparatus
4 Processing container
6 Shower head
7 Ceiling board of shower head
8 Distribution plate
9 Bolt
10 Gas hole
10A Raw material gas hole
10C 2nd support gas hole
12 Loading/unloading port
14 Gate valve
16 Bottom of processing container
18 Exhaust drop-in space
20 Opening
22 Cylindrical compartment wall
24 Bottom of cylindrical compartment wall
26 Supporting column
28 Mounting table
30 Exhaust port
32 Vacuum exhaust system
34 Exhaust pipe
36 Heating means
38 Feeder cable
40 Pin insertion hole
42 Push-up pin
44 Push-up ring
46 Arm
48 Emerging/sinking rod
50 Actuator
54 Ceiling board
55 Seal member
56 Main body of shower head
57 Bolt
58 Seal member
60 First diffusion chamber
62 Second diffusion chamber
64 Partition plate
66A Processing gas inlet
66B Support gas inlet
70 Film to be removed
AA Processing gas
BB Support gas
CC Exhaust
S Processing space
W Substrate

What is claimed is:

1. A method for cleaning a semiconductor fabrication equipment part used for processing semiconductor wafers, wherein the semiconductor fabrication equipment part comprises a distribution plate formed of aluminum or aluminum alloy and having a plurality of gas holes, the method comprising:

step (1): scanning a gas injection surface of the distribution plate, which is a surface facing the wafer, with a laser beam to remove deposits adhered to a surface of the gas injection surface and deposits near a surface of at least one of the plurality of gas holes, and to crack a film of the deposits adhered to inside of said at least one of the plurality of gas holes, or to peel a film of the deposits from the inside of said at least one of the plurality of gas holes, wherein the laser beam is infrared and an average energy density of the laser beam is $1\times10^3$ to $1\times10^{11}$ W/m$^2$; and step (2): bringing the gas injection surface and the inside of said at least one of the plurality of gas holes into contact with a cleaning liquid containing an inorganic acid, and allowing the cleaning liquid to penetrate cracks in the film of the deposits or gaps between the film of the deposits and the inside of said at least one of the plurality of gas holes to clean the semiconductor fabrication equipment part having the plurality of gas holes.

2. The method according to claim 1, wherein an average energy of the laser beam is 10 to 5000 W.

3. The method according to claim 1, wherein the laser beam is a pulse beam.

4. The method according to claim 1, wherein the laser beam is selected from the group consisting of a CO$_2$ laser, a YAG laser, an Nd:YAG laser, an Er:Nd-YAG laser, a fiber laser and a diode laser with a wavelength of 810 to 980 nm.

5. The method according to claim 1, wherein a wavelength of the laser beam is 700 nm to 1000 μm.

6. The method according to claim 1, wherein a sweep speed of the laser beam is 0.01 to 100 mm/sec.

7. The method according to claim 1, wherein the inorganic acid comprises at least one selected from the group consisting of nitric acid, hydrochloric acid, sulfuric acid and hydrofluoric acid.

8. The method according to claim 1, wherein the cleaning liquid comprises an oxidizing agent.

9. The method according to claim 1, wherein the distribution plate is immersed in the cleaning liquid.

10. The method according to claim 1, wherein the deposits comprise a reaction product of an etching gas and aluminum.

11. The method according to claim 1, wherein the deposits are derived from a film-forming gas.

12. The method according to claim 1, further comprising a step (3) of irradiating the gas injection surface with ultrasonic waves between the step (1) and the step (2).

13. The method according to claim 1, wherein the semiconductor fabrication equipment part having said plurality of gas holes is a shower head.

14. The method according to claim 2, wherein the laser beam is a pulse beam.

15. The method according to claim 2, wherein the laser beam is selected from the group consisting of a CO$_2$ laser, a YAG laser, an Nd: YAG laser, an Er: Nd-YAG laser, a fiber laser and a diode laser with a wavelength of 810 to 980 nm.

16. The method according to claim 2, wherein a wavelength of the laser beam is 700 nm to 1000 μm.

17. The method according to claim 2, wherein a sweep speed of the laser beam is 0.01 to 100 mm/sec.

18. The method according to claim 3, wherein the pulse beam has a pulse frequency of 10 Hz to 500 kHz.

19. The method according to claim 9, wherein the distribution plate is immersed in the cleaning liquid for 0.5 to 24 hours.

20. The method according to claim 14, wherein the pulse beam has a pulse frequency of 10 Hz to 500 kHz.

* * * * *